(12) United States Patent
Noh et al.

(10) Patent No.: US 11,178,320 B2
(45) Date of Patent: Nov. 16, 2021

(54) ELECTRONIC DEVICE INCLUDING ELECTRONIC COMPONENT DISPOSED THROUGH DISPLAY

(71) Applicant: SAMSUNG ELECTRONICS CO., LTD., Suwon-si (KR)

(72) Inventors: Daeyoung Noh, Suwon-si (KR);
Sangmin Kim, Suwon-si (KR);
Minchang Shim, Suwon-si (KR);
Sunghyup Lee, Suwon-si (KR);
Seunghoon Lee, Suwon-si (KR);
Minjong Lim, Suwon-si (KR);
Heeseok Jung, Suwon-si (KR);
Daehyeong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/731,497

(22) Filed: Dec. 31, 2019

(65) Prior Publication Data

US 2020/0267293 A1 Aug. 20, 2020

(30) Foreign Application Priority Data

Feb. 19, 2019 (KR) .................. 10-2019-0019181

(51) Int. Cl.
*H04N 5/225* (2006.01)
*H01L 51/52* (2006.01)
*H04M 1/02* (2006.01)
*G02B 7/02* (2021.01)
(Continued)

(52) U.S. Cl.
CPC ............ *H04N 5/2254* (2013.01); *G02B 7/02* (2013.01); *G06F 3/041* (2013.01); *H01L 51/5246* (2013.01); *H04M 1/0264* (2013.01); *H04M 1/0266* (2013.01); *H04N 5/2253* (2013.01);
(Continued)

(58) Field of Classification Search
CPC ......................... H04N 5/2254; H04N 5/2253; H01L 51/5246; H04M 1/0266; H04M 1/0264; H05K 1/0203; H05K 1/0209; H05K 2201/10121; H05K 2201/10151; H05K 2201/0323; H05K 2201/10128; G02B 7/02; G06F 3/041
See application file for complete search history.

(56) References Cited

U.S. PATENT DOCUMENTS 9,462,165 B2 * 10/2016 Moon ................. H04M 1/0264
10,620,665 B2 * 4/2020 Cheng ................ H04M 1/0264
10,852,861 B2 * 12/2020 Kim .................. G02F 1/133308
(Continued)

FOREIGN PATENT DOCUMENTS

KR 10-2018-0055988 5/2018

*Primary Examiner* — Pritham D Prabhakher
(74) *Attorney, Agent, or Firm* — Nixon & Vanderhye P.C.

(57) ABSTRACT

According to various embodiments, an electronic device includes a front plate, a display visible from outside the electronic device through at least a portion of the front plate and is disposed in an internal space of the electronic device, the display including a plurality of layers, and a first opening, an image sensor disposed in the internal space and to be visible through the first opening, and an adhesive layer including a second opening overlapping the first opening between the front plate and the display, the second opening being smaller than the first opening wherein an edge of the first opening is not visible when the display is viewed from above.

18 Claims, 16 Drawing Sheets

(51) Int. Cl.
*H05K 1/02* (2006.01)
*G06F 3/041* (2006.01)

(52) U.S. Cl.
CPC . *H05K 1/0203* (2013.01); *H05K 2201/10121* (2013.01); *H05K 2201/10151* (2013.01)

(56) References Cited

U.S. PATENT DOCUMENTS

| | | | |
|---|---|---|---|
| 10,879,493 B2* | 12/2020 | Kim | G06K 9/2036 |
| 10,942,385 B2* | 3/2021 | Wang | H01L 51/5284 |
| 2018/0138447 A1 | 5/2018 | Jin et al. | |
| 2018/0241861 A1* | 8/2018 | Kim | H04M 1/026 |
| 2018/0310426 A1* | 10/2018 | Cho | H04M 1/18 |
| 2019/0012007 A1* | 1/2019 | Kim | G06F 1/1652 |
| 2019/0079604 A1* | 3/2019 | Kim | G06F 3/041 |
| 2019/0165049 A1* | 5/2019 | Kim | H01L 51/56 |
| 2019/0235691 A1* | 8/2019 | Kim | G06F 3/04164 |
| 2019/0243417 A1* | 8/2019 | Cheng | G06F 1/1605 |
| 2019/0245958 A1* | 8/2019 | Cheng | G06F 1/1656 |
| 2019/0302504 A1* | 10/2019 | Wang | G06K 9/00013 |
| 2019/0335026 A1* | 10/2019 | Cheng | H04M 1/0266 |
| 2019/0335027 A1* | 10/2019 | Cheng | H04M 1/0264 |
| 2020/0174295 A1* | 6/2020 | Baek | G02F 1/1339 |

* cited by examiner

ELECTRONIC DEVICE INCLUDING ELECTRONIC COMPONENT DISPOSED THROUGH DISPLAY

CROSS-REFERENCE TO RELATED APPLICATION(S)

This application is based on and claims priority under 35 U.S.C. § 119 to Korean Patent Application No. 10-2019-0019181, filed on Feb. 19, 2019, in the Korean Intellectual Property Office, the disclosure of which is incorporated by reference herein in its entirety.

BACKGROUND

Field

The disclosure relates to an electronic device including an electronic component disposed through a display.

Description of Related Art

The development of electronic devices, for example, portable electronic devices, has been applied to various fields that are highly associated with our lives. Such electronic devices are released in various sizes according to their functions and user preferences, and may include a large screen display for securing wide visibility and improving convenience of operation. In addition, even if electronic devices have the same size, technical improvements in which the display area of one electronic device can be relatively expanded than that of the other electronic device are being sought.

An electronic device may include a display that can be visible from the outside through at least a portion of a front plate (e.g., a transparent window, a cover member, or a front cover). In order to meet the needs of a large screen, the area of the display is gradually expanding, whereby the display can be exposed through substantially the entire area of the front plate. In response to this expansion of the display area, various electronic components, the arrangement structure of various electronic components disposed to detect an external environment through the front plate, for example, at least one camera device or various sensors (e.g., an illuminance sensor, an iris sensor, or an infrared ray) may also be transformed. For example, such electronic components may be limited in extending the display area when they are disposed in a black matrix (BM) area other than the display area of the front plate.

In order to expand the display area and to facilitate the arrangement of the electronic components, the display may include openings (e.g., punch holes or perforation holes) formed at positions facing the electronic components. The electronic component is disposed near the rear surface of the front plate in such a manner that the electronic component at least partially penetrates the opening, and functions of the electronic component may be performed. In particular, in the case of a camera device among the electronic components, a barrel is disposed in a state in which at least a portion of the barrel at least partially penetrates the opening of the display, and therefore the display may be hit by the displacement of the barrel according to an external impact of the electronic device. This may cause malfunction of the electronic device.

The above information is presented as background information only to assist with an understanding of the disclosure. No determination has been made, and no assertion is made, as to whether any of the above might be applicable as prior art with regard to the disclosure.

SUMMARY

Embodiments of the disclosure provides an electronic device that includes an electronic component disposed through a display.

Another embodiment of the disclosure provides an electronic device that includes a display laminated structure in which breakage by an electronic component being displaced by an external impact can be prevented and/or reduced.

In accordance with an example aspect of the disclosure, an electronic device includes: a front plate; a display visible from outside the electronic device through at least a portion of the front plate and disposed in an internal space of the electronic device, the display including a plurality of layers and a first opening; an image sensor disposed in the internal space and configured to be visible through the first opening; and an adhesive layer including a second opening overlapping the first opening between the front plate and the display, the second opening being smaller than the first opening wherein an edge of the first opening is not visible when the display is viewed from above.

In accordance with another example aspect of the disclosure, an electronic device includes: a front plate; a display visible from outside the electronic device through at least a portion of the front plate and disposed in an internal space of the electronic device, the display including a plurality of layers and at least one first opening; at least one electronic component comprising electronic circuitry configured to detect an external environment through the at least one first opening and being disposed in the internal space; and an adhesive layer including at least one second opening overlapping the first opening between the front plate and the display, the second opening being smaller than the first opening wherein an edge of the first opening is not visible when the display is viewed from above.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

FIGS. 1 through 11c, discussed below, and the various example embodiments used to describe the principles of the present disclosure in this disclosure are by way of illustration only and should not be understood in any way to limit the scope of the disclosure. Those skilled in the art will understand that the principles of the present disclosure may be implemented in any suitably arranged system or device.

Hereinafter, various example embodiments of the present disclosure are described in greater detail with reference to the accompanying drawings.

Figure 1:
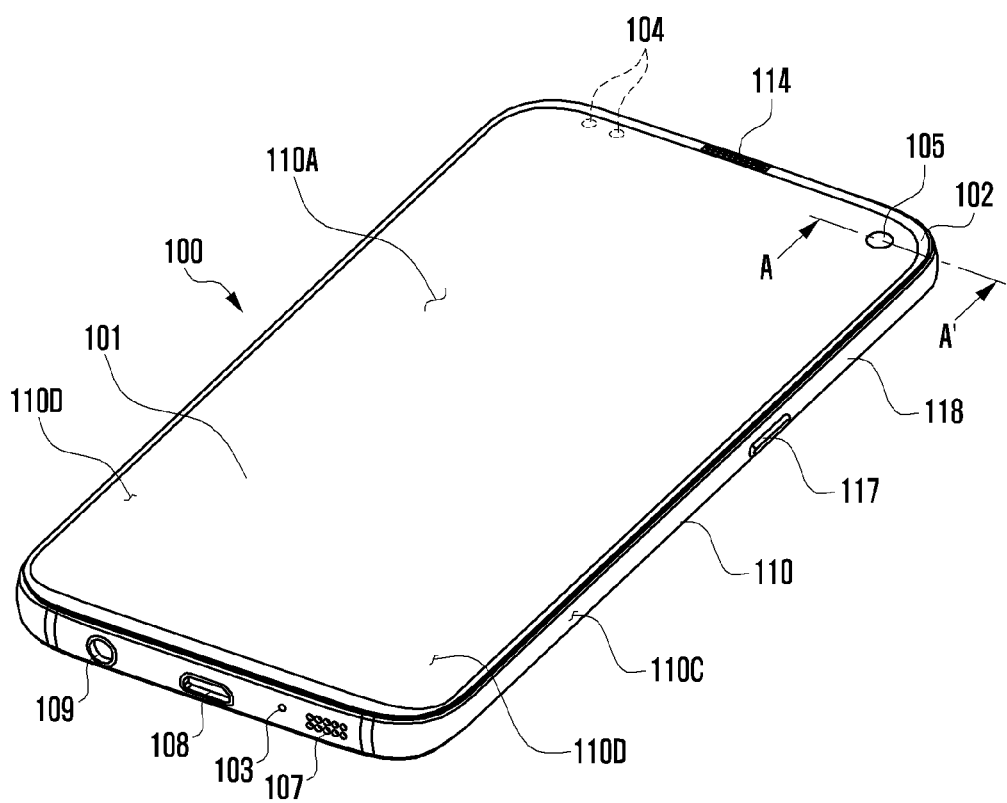
FIG. 1 is a front perspective view illustrating an example mobile electronic device according to various embodiments of the disclosure.
Figure 2:
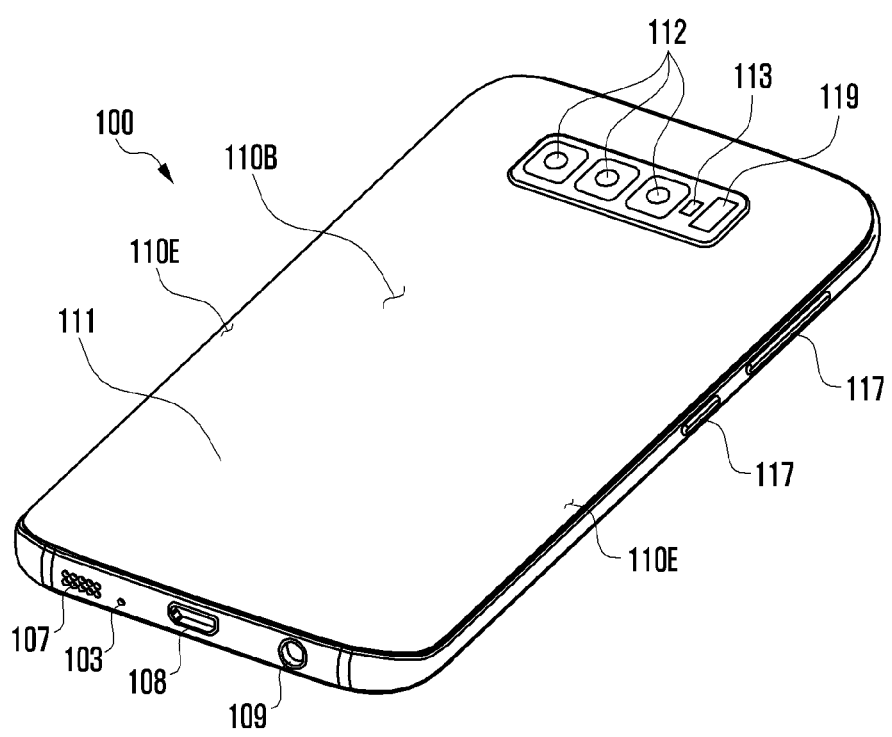
FIG. 2 is a rear perspective view illustrating a rear side of the example electronic device of FIG. 1 according to various embodiments of the disclosure.

FIG. 1 is a front a perspective view illustrating a front surface of an example mobile electronic device 100 according to an embodiment, and FIG. 2 is a rear perspective view illustrating a rear surface of the mobile electronic device 100 shown in FIG. 1.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104, 116 and 119, camera modules 105, 112 and 113, a key input device 117, a light emitting device, and connector holes 108 and 109. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, the fingerprint sensor 116, and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
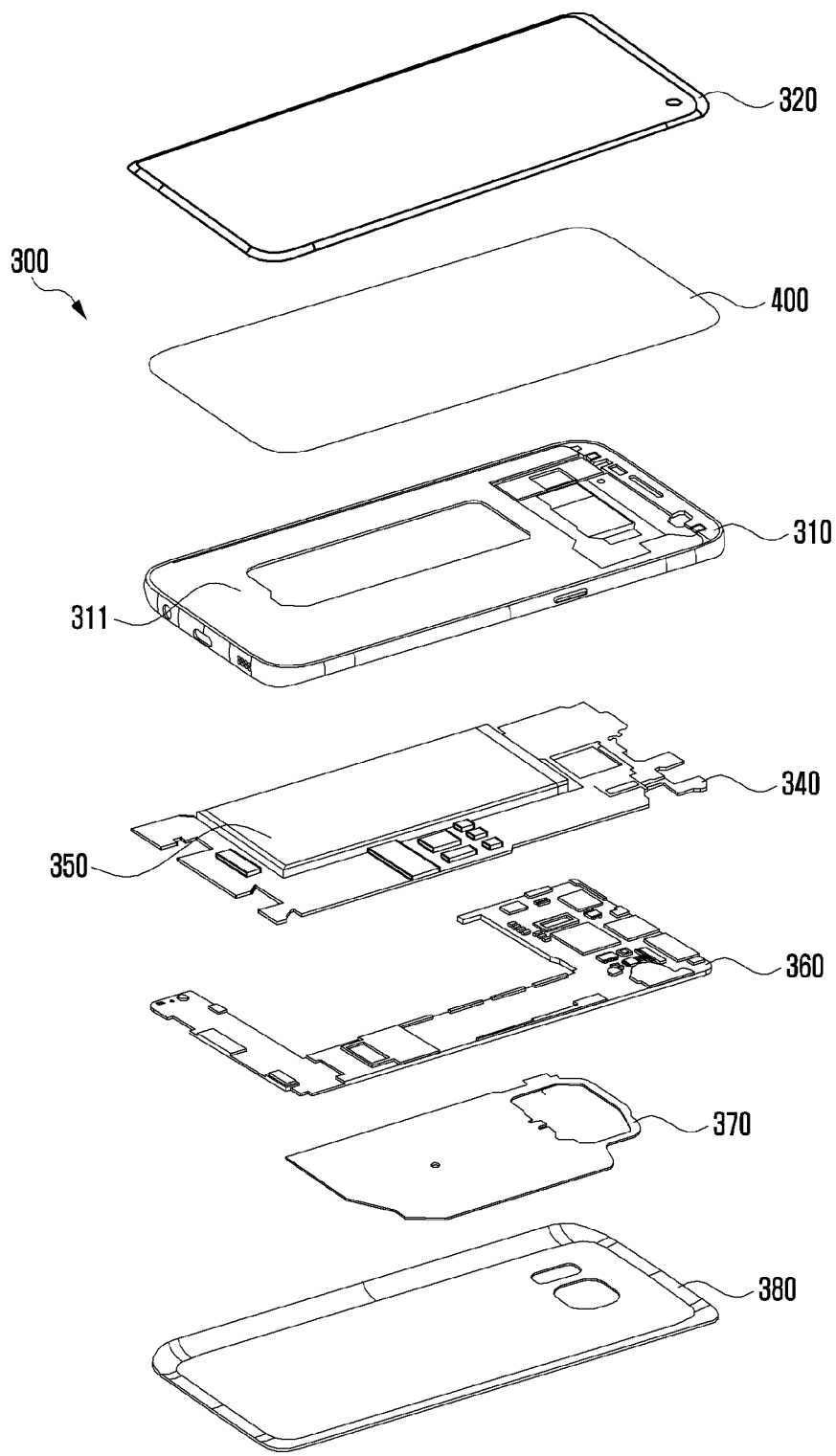
FIG. 3 is an exploded perspective view illustrating the example electronic device of FIG. 1 according to various embodiments of the disclosure.

FIG. 3 illustrates an exploded perspective view showing a mobile electronic device 300 shown in FIG. 1.

Referring to FIG. 3, the mobile electronic device 300 may include a lateral bezel structure 310, a first support member 311 (e.g., a bracket), a front plate 320, a display 400, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 400 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
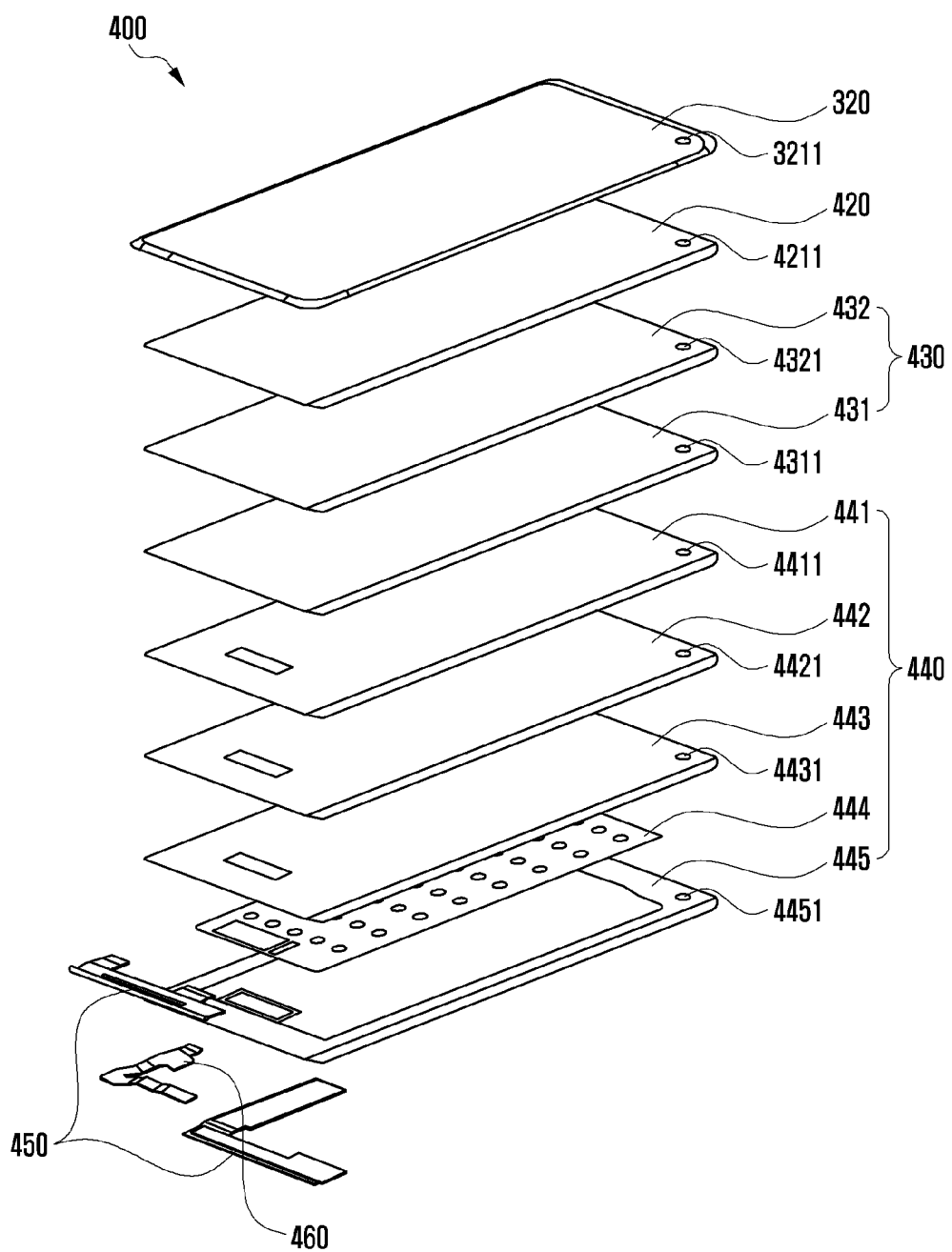
FIG. 4 is an exploded perspective view illustrating an example display device according to various embodiments of the disclosure.

FIG. 4 is an exploded perspective view illustrating an example display device 400 according to various embodiments of the disclosure.

The display device 400 of FIG. 4 may be at least partially similar to the display 101 of FIG. 1 or the display 400 of FIG. 3, or may further include other embodiments of the display device.

Referring to FIG. 4, the display device 400 (e.g., a display) may include a front plate 320 (e.g., the front plate 102 of FIG. 1), an adhesive layer 420 sequentially stacked from the rear surface (e.g., the rear surface 321 of FIG. 5) of the front plate 320, a display 430 and a support member 440. According to an embodiment, the front plate 320 may include a camera exposure area 3211 disposed at a position corresponding to a camera module (e.g., a camera module 500 of FIG. 5). According to an embodiment, the camera exposure area 3211 may be determined by a print area (e.g., a BM area) (e.g., a print area 322 of FIG. 5) disposed to surround the periphery thereof. According to an embodiment, the size or shape of the print area (e.g., the print area 322 of FIG. 5) may be determined by the angle of view of the camera module. In another embodiment, the front plate 320 may include only the camera exposure area 3211 without a separate print area. According to an embodiment, the adhesive layer 420 may include, for example, and without limitation, an optical clear adhesive (OCA), a pressure sensitive adhesive (PSA), a thermally reactive adhesive, a general adhesive, a double-sided tape, or the like.

According to various embodiments, the display 430 may include a display panel 431 and a polarizer (POL) 432 (e.g., a polarizing film) disposed between the display panel 431 and the adhesive layer 420. In another embodiment, the display panel 431 and the POL 432 may be integrally formed. In another embodiment, the display 430 may include the POL 432, the display panel 431, and a support member 440. According to an embodiment, the display 430 may additionally include a touch panel. According to an embodiment, the display 430 may include a control circuit 450. According to an embodiment, the control circuit 450 may include a flexible printed circuit board (FPCB) that electrically connects the main printed circuit board of the electronic device (e.g., the electronic device 300 of FIG. 3) to the display panel 431, and a display driver IC (DDI) mounted in the FPCB. In another embodiment, when the display 430 may be an in-cell or on-cell touch display, the control circuit 450 may include a touch display driver IC (TDDI). The display device 400 may include a fingerprint sensor 460 disposed around the control circuit 450. According to an embodiment of the disclosure, the fingerprint sensor 460 may include, for example, an ultrasonic type sensor or an optical type sensor that can recognize a fingerprint of a finger in contact with or in proximity to the outer surface of the front plate 320 through a hole formed at least partially in some of the components of the display device 400.

According to various embodiments, the support member 440 may include one or more polymer members 441 and 442 sequentially stacked on the rear surface of the display 430, and a functional member 444 and a conductive member 445 which are attached to the polymer members 441 and 442 via an adhesive member 443. According to an embodiment, the one or more polymer members 441 and 442 may include an emboss layer 441 for removing bubbles that may be generated between the display panel 431 and lower attachments of the display panel 431, and a cushion layer 442 disposed to cushion the impact. According to an embodiment, the functional member 444 may include a graphite sheet for heat dissipation, an added display, a force touch FPCB, a fingerprint sensor FPCB, a communication antenna radiator, a heat dissipation sheet, a conductive/non-conductive tape, or an open cell sponge. According to an embodiment, the conductive member 445 may include a metal plate, which can help rigidity reinforcement of the electronic device (e.g., the electronic device 300 of FIG. 3), shield ambient noise, and dissipate heat emitted from ambient heat dissipation components. According to an embodiment, the conductive member 445 may include, for example, and without limitation, Cu, Al, SUS, or CLAD (e.g., a laminated member in which SUS and Al are alternately disposed). In another embodiment, the display device 400 may further include a detection member for detecting an input by a writing member of an electromagnetic induction method. According to an embodiment, the detection member may include a digitizer.

According to various embodiments, the front plate 320 may include the camera exposure area 3211 at least partially formed in an area overlapping the display 430 when the front plate 320 is viewed from above. According to an embodiment, when the front plate 320 is viewed from above, the display 430 may include first openings 4311 and 4321 (e.g., a first opening OP1 of FIG. 5) formed in an area overlapping the camera exposure area 3211. According to an embodiment, when the front plate 320 is viewed from above, the adhesive layer 420 for attaching the display 430 to the rear surface of the front plate 320 may also include a second opening 4211 (e.g., a second opening OP2 of FIG. 5) formed to at least partially overlap the first openings 4311 and 4321. According to an embodiment, when the front plate 320 is viewed from above, the support member 440 may include third openings 4411, 4421, 4431, and 4451 (e.g., a third opening OP3 of FIG. 5) formed to at least partially overlap the second opening 4211. According to an embodiment, the electronic device (e.g., the electronic device 300 of FIG. 3) may include a camera module (e.g., a camera module 500 of FIG. 5) that is disposed near or to the rear surface (e.g., the rear surface 321 of FIG. 5) of the front plate 320 through the first openings 4311 and 4321, the second opening 4211, or the third openings 4411, 4421, 4431, and 4451. For example, the camera module (e.g., the camera module 500 of FIG. 5) may be disposed to at least partially approach the second opening 4211. According to an embodiment, the camera module (e.g., the camera module 500 of FIG. 5) may be disposed such that the second opening 4211 is closest to the camera module (e.g., the camera module of FIG. 5) while being disposed through the first openings 4311 and 4321 of the display 430, the second openings 4211 of the adhesive layer 420, or the third openings 4411, 4421, 4431, and 4451 of the support member 440. Therefore, when the camera module (e.g., the camera module 500 of FIG. 5) is randomly displaced by an external impact, the camera module (e.g., the camera module 500 of FIG. 5) preferentially contacts the adhesive layer 420, whereby a buffering action may be expressed to prevent breakage of the display 430.

Hereinafter, the relative arrangement structure of the first openings 4311 and 4321 formed in the display 430, the second opening 4211 formed in the adhesive layer 420, or the third openings 4411, 4421, 4431, and 4451 formed in the support member 440 will be described in greater detail.

Figure 5:
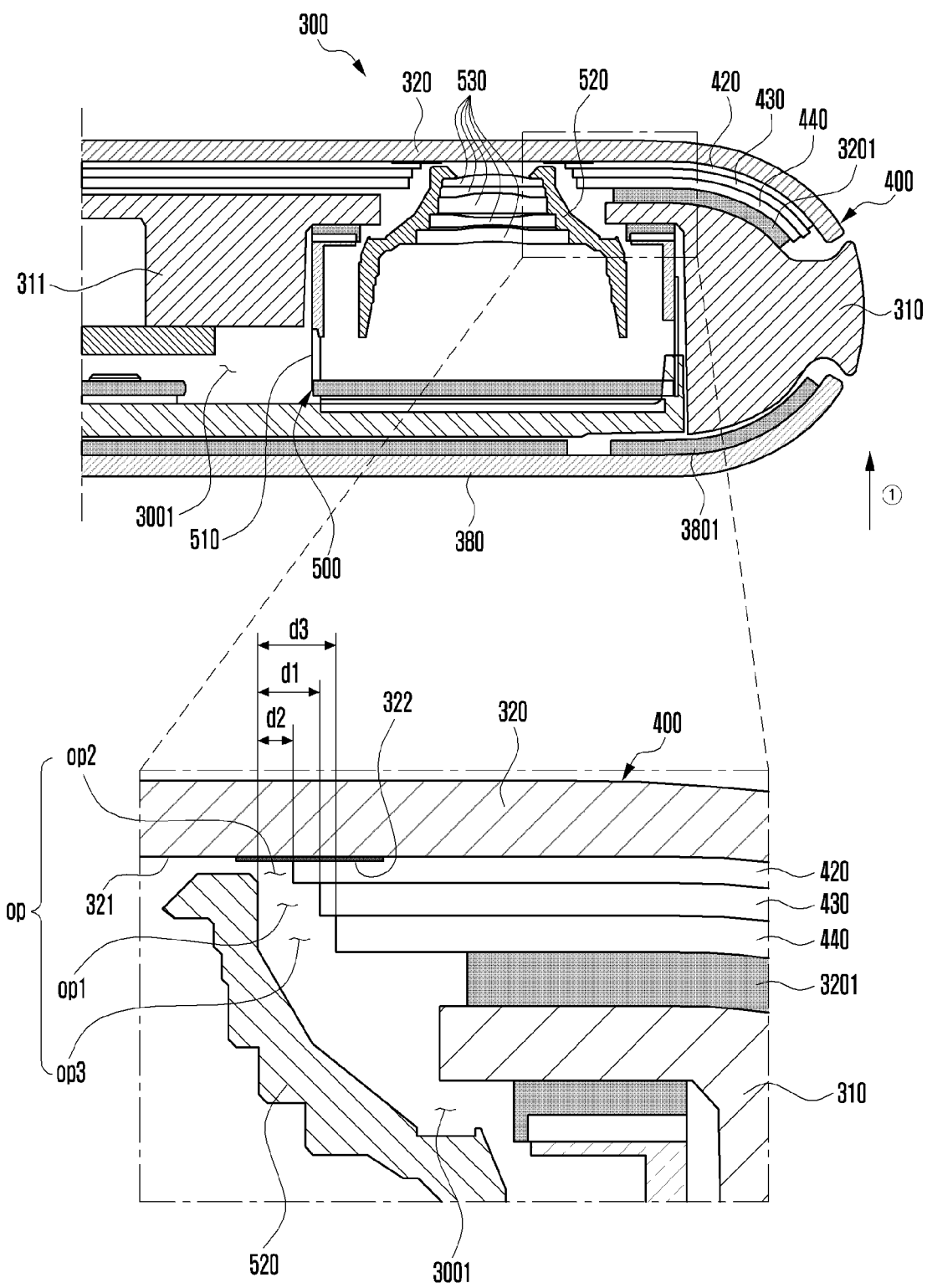
FIG. 5 is a partial cross-sectional view illustrating an example electronic device as viewed from line A-A' of FIG. 1 according to various embodiments of the disclosure.
Figure 6:
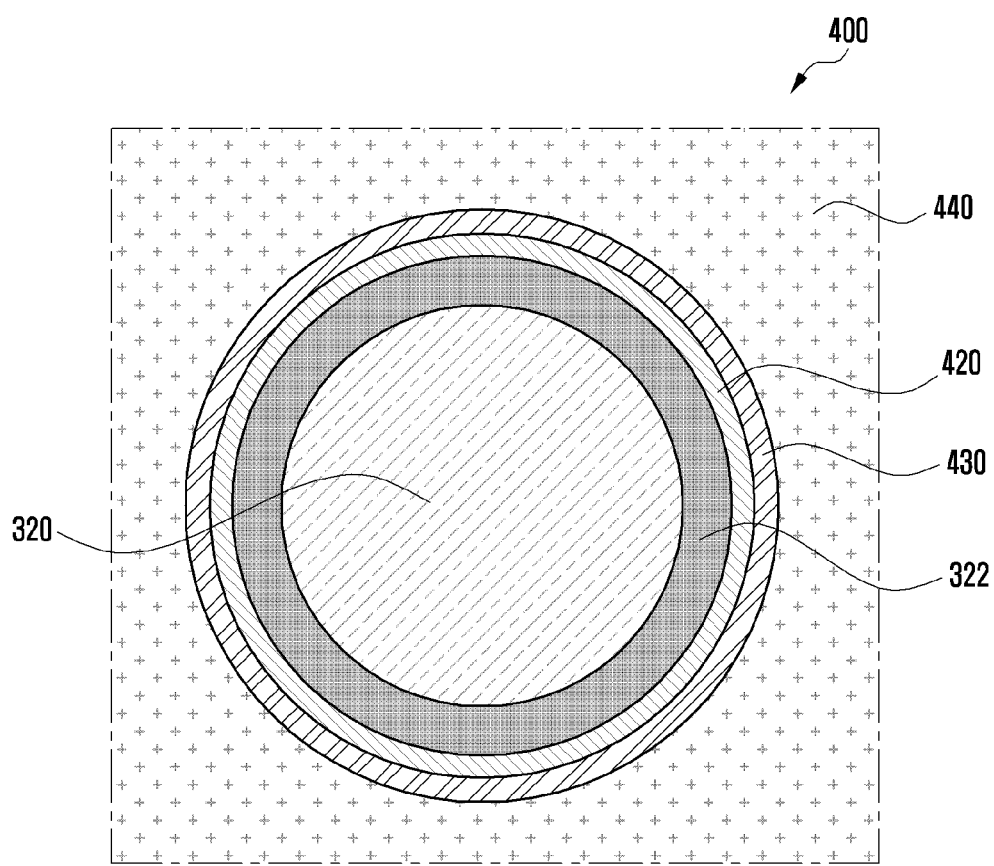
FIG. 6 is a diagram illustrating an example display device viewed from the rear surface of a front plate according to various embodiments of the disclosure.

FIG. 5 is a partial cross-sectional view illustrating the example electronic device 300 as viewed from line A-A' of FIG. 1 according to various embodiments of the disclosure. FIG. 6 is a diagram illustrating the example display device 400 according to various embodiments of the disclosure viewed from the rear surface of the front plate 320.

Referring to FIGS. 5 and 6, the electronic device 300 may include the front plate 320 (e.g., a first plate or a front window) facing a first direction (D direction), the rear plate 380 (e.g., a second plate or a rear window) facing the opposite direction to the front plate 320, and a side member 310 surrounding a space 3001 between the front plate 320 and the rear plate 380. According to an embodiment of the disclosure, the electronic device 300 may include a first waterproof member 3201 disposed between the rear surface of the support member 440 and the side member 310. According to an embodiment, the electronic device 300 may include a second waterproof member 3801 disposed between the side member 310 and the rear plate 380. The first waterproof member 3201 and the second waterproof member 3801 may prevent and/or reduce foreign substances or moisture from entering an internal space 3001 of the electronic device 300.

According to various embodiments, the side member 310 may further include a first support structure 311 that at least partially extends in the internal space 3001 of the electronic device 300. According to an embodiment, the first support structure 311 may at least partially penetrate through the opening OP of the display device 400 and may support the camera module 500 disposed in the internal space 3001 of the electronic device 300 in a position where the camera module 500 can be visible through the front plate 320.

According to various embodiments, the electronic device 300 may include an adhesive layer 420 sequentially disposed with the side member 310 in the rear surface 321 of the front plate 320, a display 430, and a support member 440. According to an embodiment, when the front plate 320 is viewed from above, the display 430, adhesive layer 420, and support member 440 of the display device 400 may include openings OP formed to at least partially overlap them. According to an embodiment, when the front plate 320 is viewed from above, the openings OP may include a first opening OP1 formed on the display 430 in a position overlapping a camera exposure area (e.g., the camera exposure area 3211 of FIG. 4) formed in the front plate 320, a second opening OP2 formed in the adhesive layer 420 so as to at least partially overlap the first opening OP1, and a third opening OP3 formed in the support member 440 so as to at least partially overlap the first opening OP1. According to an embodiment, the first opening OP1, the second opening OP2, or the third opening OP3 may be arranged so as to have the same center as the camera exposure area (e.g., the camera exposure area 3211 of FIG. 4) of the front plate 320. For example, the first opening OP1, the second opening OP2, or the third opening OP3 may be arranged to have a concentric circle when the camera exposure area of the front plate 320 (e.g., the camera exposure area 3211 of FIG. 4) is formed in a circular shape. In this case, it may be arranged to have concentric circles.

According to various embodiments, the camera module 500 (e.g., an image sensor) may include a camera housing 510, a barrel 520 that at least partially protrudes from the camera housing 510, and lens groups 530 disposed in the barrel 520 at regular intervals. According to an embodiment, the camera module 500 may include at least one image sensor member disposed in the internal space of the camera housing 510 to be aligned with the lens groups 320. According to an embodiment, the camera module 500 is disposed such that at least a portion of the barrel 520 contacts or approaches the rear surface 321 of the front plate 320 through the opening OP of the display device 400.

According to various embodiments, the electronic device 300 may include a print area 322 formed on the front plate 320 between the rear surface 321 of the front plate 320 and the adhesive layer 420. According to an embodiment, the print area 322 is formed to have a width that overlaps at least the edge of the opening OP and extends up to at least a portion of the barrel 520 when the front plate 320 is viewed from above. For example, the print area 322 may be formed up to the at least a portion of the barrel 520, but may extend to a position that does not overlap the lens groups 530 to form an angle of view of the camera module 500.

According to various embodiments, the first opening OP1, the second opening OP2, or the third opening OP3 may be formed to have a different distance from the edge of the barrel 520. For example, the second opening OP2 may have a distance d2 between the edge of the second opening OP2 and the edge of the barrel 520 which is shorter than a distance d1 between the edge of the first opening OP1 and the edge of the barrel 520. According to an embodiment, the first opening OP1 may have the distance d1 between the edge of the first opening OP1 and the edge of the barrel 520 which is shorter than a distance d3 between the edge of the third opening OP3 and the edge of the barrel 520. According to an embodiment, when the front plate 320 is viewed from above, the first opening OP1 may be disposed not to be visible by the second opening OP2, and the third opening OP3 may be disposed not to be visible by the first opening OP1. Thus, when the front plate is viewed from above, the first opening OP1, the second opening OP2, or the third opening OP3 may have the same center and shape and have different sizes thereof. For example, the opening OP may be formed to gradually increase in size in order of the second opening OP2, the first opening OP1, and the third opening OP3.

Therefore, when the camera module 500 is randomly displaced by an external impact (e.g., a drop) of the electronic device 300, the barrel 520 may be preferentially brought into contact with the adhesive layer 420, whereby the impact to be transmitted to the display 430 may be preferentially absorbed through the adhesive layer 420.

FIG. 6 is a layout view obtained when the display device 300 is viewed in the rear direction (①direction) of the front plate 320 from the internal space 3001 of the electronic device 300. The display device 400 may include the support member 440, the display 430 of which the edge is visible through at least a portion of the support member 440, and the adhesive layer 420 of which the edge is visible through at least a portion of the display 430. According to an embodiment, the print area 322 formed on the rear surface 321 of the front plate 320 can be seen through the second opening (e.g., the second opening OP2 of FIG. 5) formed by the adhesive layer 420, and the camera exposure area (e.g., the camera exposure area 3211 of FIG. 4) of the front plate 320 may be determined by the print area 322.

Figure 7:
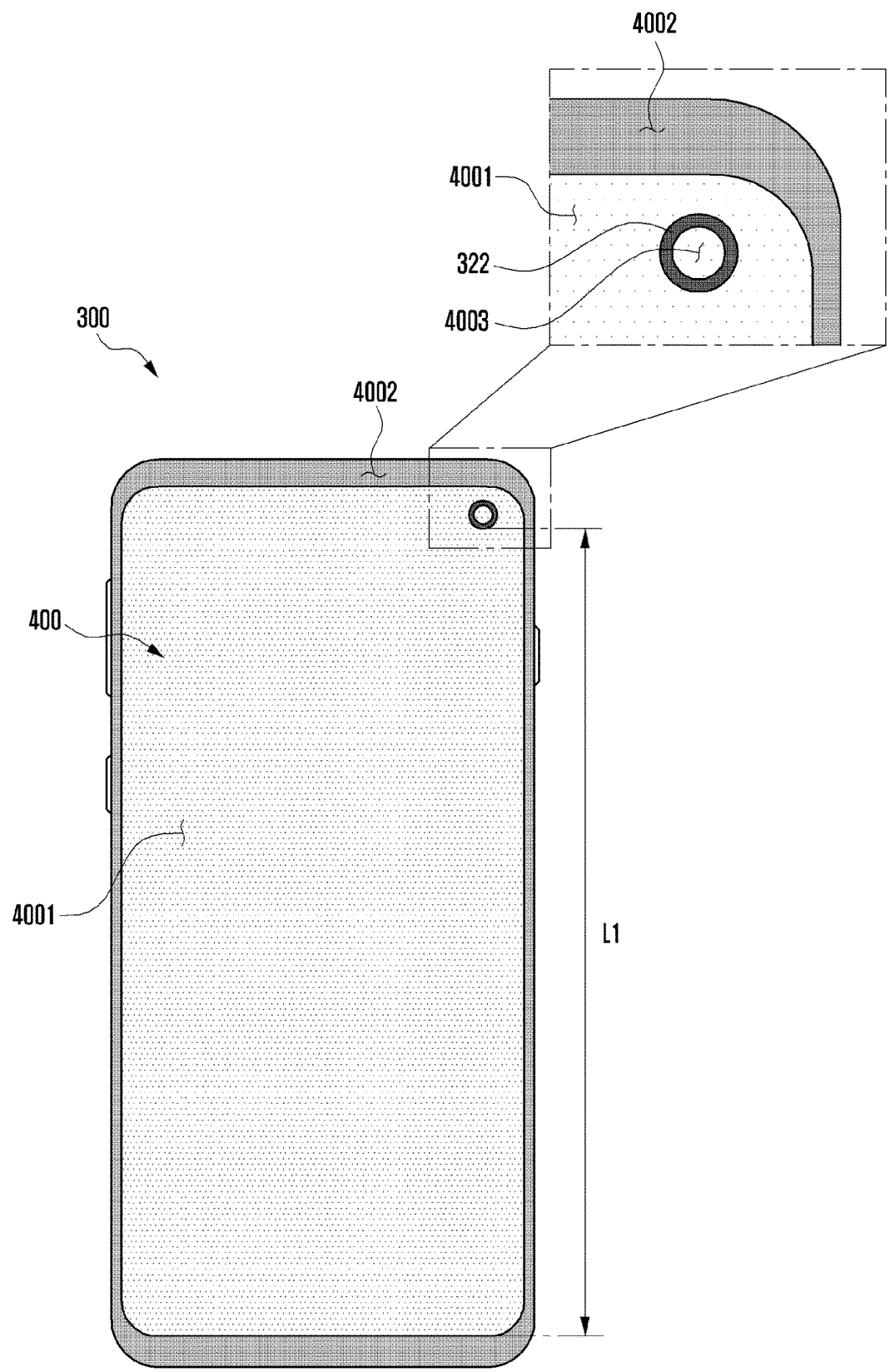
FIG. 7 is a diagram illustrating an arrangement relationship of a camera exposure area of an example electronic device according to various embodiments of the disclosure.

FIG. 7 is a diagram illustrating an arrangement relationship of a camera exposure area 4003 of the example electronic device 300 according to various embodiments of the disclosure.

Referring to FIG. 7, the electronic device 300 may include the display device 400. According to an embodiment, the display device 400 (e.g., display) may include a display area 4001 (e.g., an active area), a BM area 4002 disposed to have a predetermined width along the edge of the display area 4001 (e.g., an inactive area), and the camera exposure area 4003 disposed in the display area 4001. According to an embodiment, the size of the camera exposure area 4003 may be determined through the print area 322 having a predetermined width surrounding a periphery thereof.

According to various embodiments, the camera exposure area 4003 may be determined in the longitudinal direction of the electronic device 300 in consideration of an aspect ratio. For example, the camera exposure area 4003 may consider a distance L1 up to the lower end of the display area 4001 in consideration of an aspect ratio for displaying contents mainly used in the electronic device. For example, when the overall aspect ratio is determined to be 19:9 and the main aspect ratio is 18:9, the camera exposure area 4003 may be disposed between the two aspect ratios in the longitudinal direction of the electronic device. Although not shown, the number of pixels that are not displayed according to the size of the camera exposure area 4003 may be determined. In this case, the display area around the print area 322 may be finely adjusted in size and position, whereby the display area may be an integer multiple of unit pixels, thereby minimizing and/or reducing an area that is not displayed. In another embodiment, a pixel map (e.g., on/off setting) may be adjusted symmetrically in the horizontal and vertical directions, whereby the display area around the print area 322 has a smooth curve shape such as a circle or an ellipse.

Figure 8:
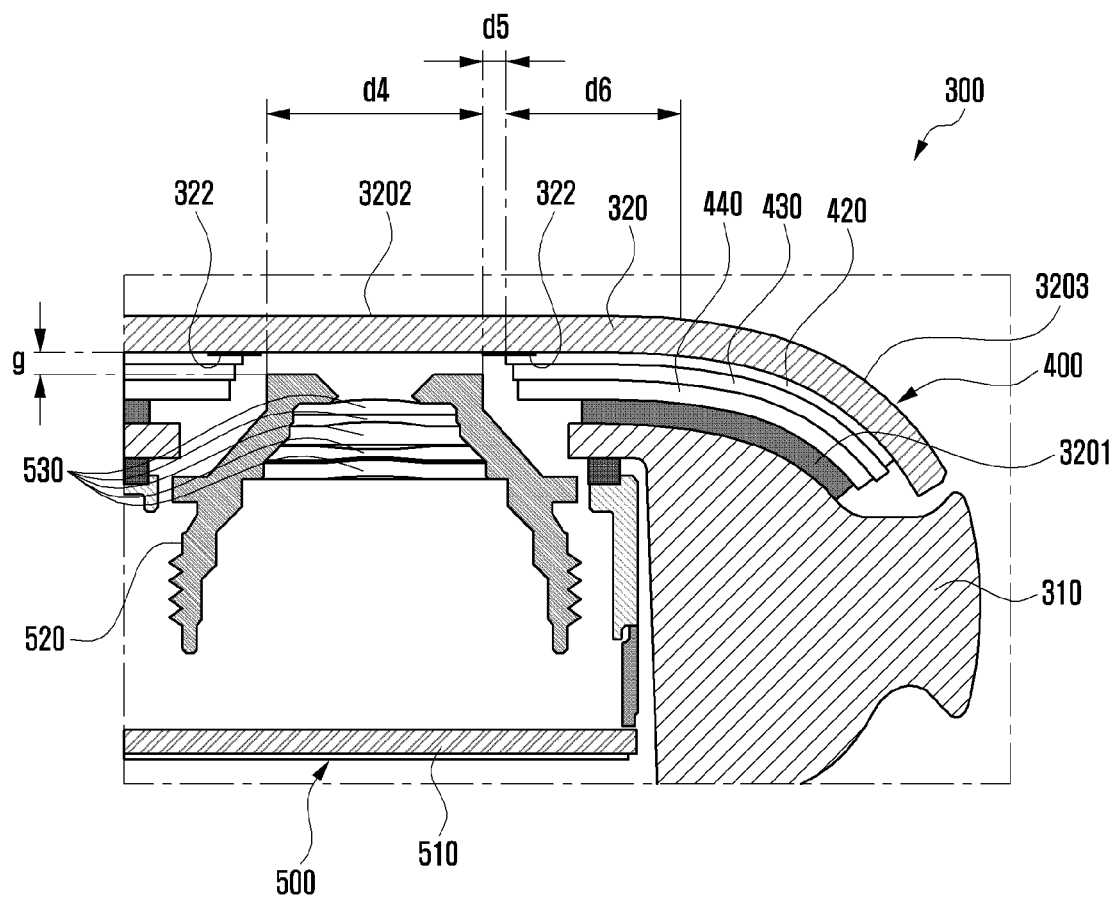
FIG. 8 is a cross-sectional view illustrating an example camera module arrangement relationship of an example electronic device according to various embodiments of the disclosure.

FIG. 8 is a cross-sectional view illustrating an arrangement relationship of a camera module 500 of the example electronic device 300 according to various embodiments of the disclosure.

Referring to FIG. 8, a camera exposure area (e.g., the camera exposure area 4003 of FIG. 7) may be determined in size according to the arrangement of peripheral components. For example, the camera exposure area (e.g., the camera exposure area 4003 of FIG. 7) may be determined in size in consideration of a diameter d4 of the barrel 520. For example, when the size of the barrel 520 is reduced due to a reduction of the lens groups 530, the size of the opening (e.g., the opening OP of FIG. 5) of the display device 400 may be reduced and thus, the size of the print area (e.g., the print area 322 of FIG. 7) and the size of the camera exposure area (e.g., the camera exposure area 4003 of FIG. 7) may also be reduced. In another embodiment, by narrowing a gap g between the barrel 520 and the rear surface of the front plate 320, the print area (e.g., the print area 322 of FIG. 7) and camera exposure area (the camera exposure area 4003 of FIG. 7) of the display area (e.g., the display area 4001 of FIG. 7) may be reduced in size while having the same angle of view.

According to various embodiments, a dead space around the camera exposure area (e.g., the camera exposure area 4003 in FIG. 7) may be determined by adhesion tolerances in the display fabrication process, exclusion of permeable bubble areas due to opening formation, and/or an occlusion phenomenon of the active area through the print area. For example, by reducing such a dead space, a distance d5 between the barrel 520 and the display device 400 can be reduced when the print area is determined.

According to various embodiments, when the front plate 320 includes a planar portion 3202 (e.g., a first surface 110A of FIG. 1) and a curved portion 3203 (e.g., e.g., a first area 110D of FIG. 1) extending from the planar portion 3202, the camera exposure area (e.g., the camera exposure area 4003 of FIG. 7) may be disposed in the planar portion 3202. In this case, the camera exposure area (e.g., the camera exposure area 4003 of FIG. 7) may be disposed at a position spaced apart by a predetermined distance d6 in a direction of the planar portion from a point where the curved portion 3203 starts. This separation distance d6 may be determined in consideration of a wiring structure around the camera exposure area and a crack of the display (e.g., the display 430 of FIG. 5) generated when the opening is formed.

Figure 9A:
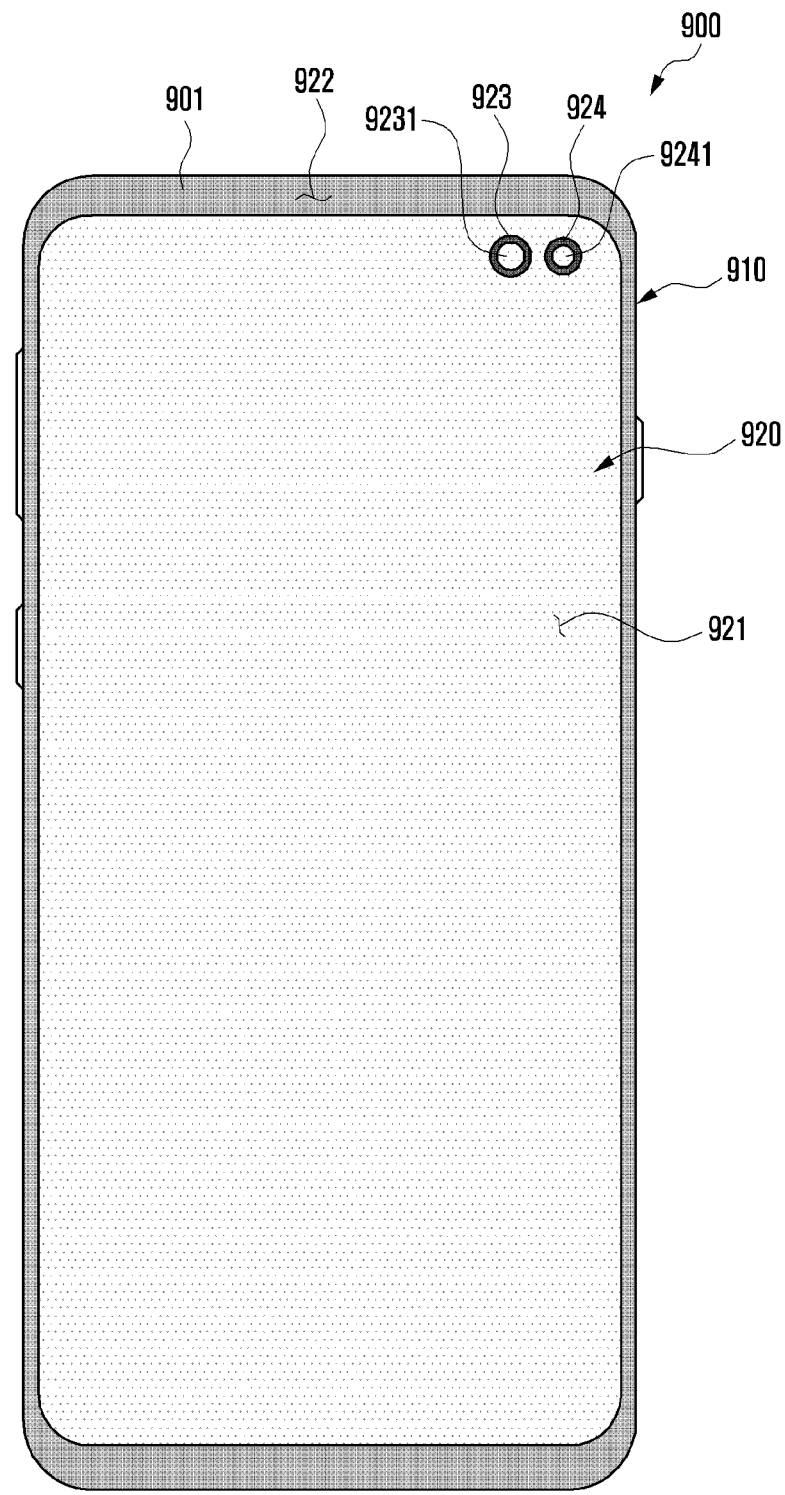
FIG. 9A is a diagram illustrating example electronic devices having an arrangement configuration of camera exposure areas according to various embodiments of the disclosure.
Figure 9B:
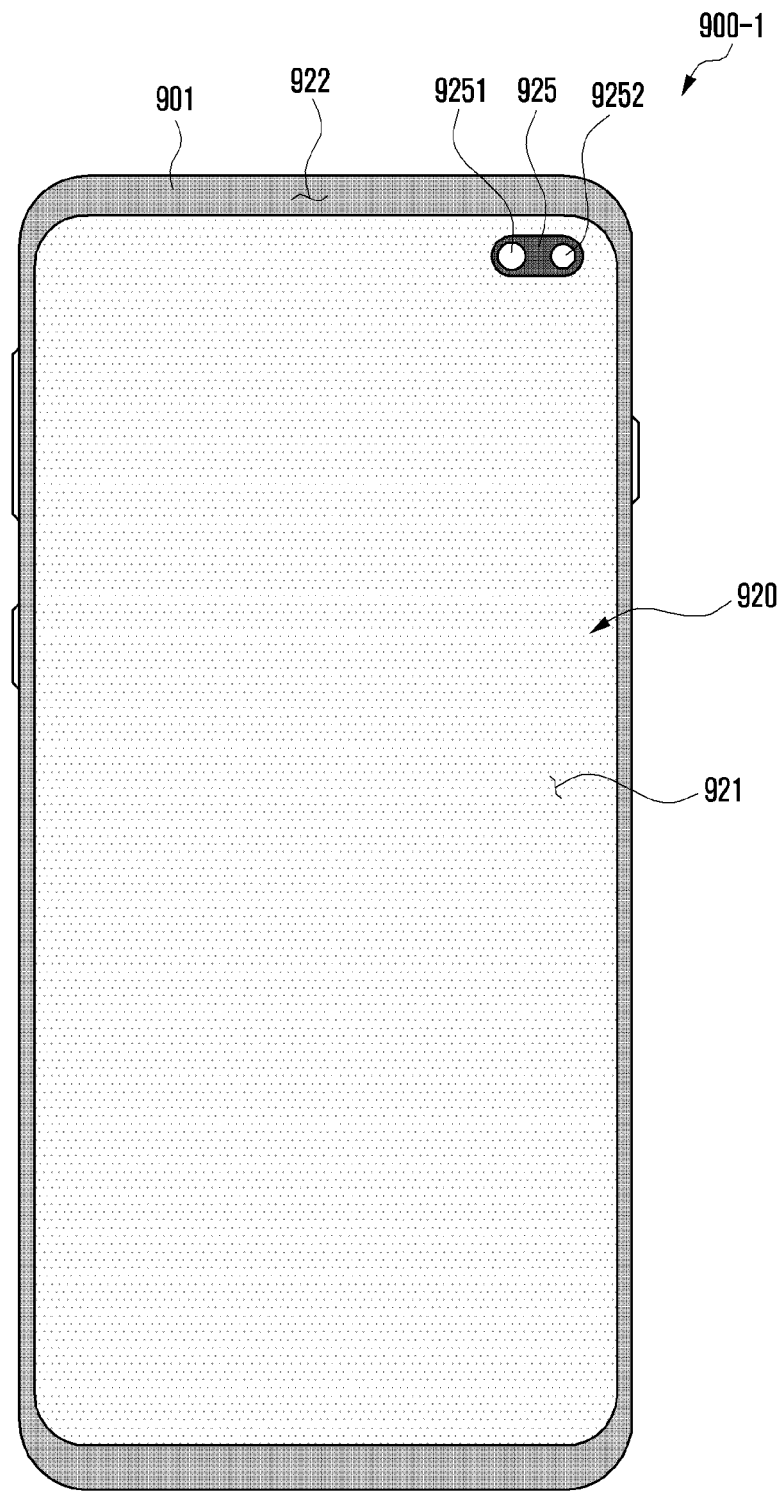
FIG. 9B is a diagram illustrating example electronic devices having an arrangement configuration of camera exposure areas according to various embodiments of the disclosure.

FIG. 9A is a diagram illustrating electronic devices having an arrangement configuration of camera exposure areas 9231 and 9241 according to various embodiments of the disclosure, and FIG. 9B is a diagram illustrating electronic devices having an arrangement configuration of camera exposure areas 9251, and 9252 according to various embodiments of the disclosure.

Electronic devices 900 and 900-1 of FIGS. 9A and 9B may be at least partially similar to the electronic device 100 of FIG. 1 or the electronic device 300 of FIG. 3, or may further include other embodiments of the electronic device.

Referring to FIG. 9A, the electronic device 900 may include a display 920. According to an embodiment, the electronic device 900 may include a display area 921 disposed through a front plate 901, a BM area 922, and a pair of camera exposure areas 9231 and 9241 disposed in the display area 921. According to an embodiment, the pair of camera exposure areas 9231 and 9241 may be disposed in close proximity to each other, and may be disposed at a position satisfying at least one of the above-described arrangement conditions. According to an embodiment, the camera exposure areas 9231 and 9241 may include the first camera exposure area 9231 disposed through a first print area 923 and the second camera exposure area 9241 disposed through a second print area 924 adjacent to the first print area 923.

Referring to FIG. 9B, the electronic device 900-1 may include a pair of camera exposure areas 9151 and 9252 disposed to be adjacent to each other at one print area 925 located in at least a portion of the display area 921 of the front plate 901. According to an embodiment, the print area 925 may be formed in an elliptical shape rather than a circular shape, whereby the print area 925 may include both the pair of camera exposure areas 9251 and 9252. In this case, the print area 925 may be disposed in the display area 921 satisfying at least one of the above-described arrangement conditions.

Although not shown, in the electronic device, in addition to the pair of camera exposure areas, three or more camera exposure areas may be disposed in the display area of the electronic device together with the corresponding print area. In another embodiment, the electronic device may include at least two print areas, and may include at least one camera exposure area among the respective print areas.

According to various example embodiments of the disclosure, a configuration in which the camera module disposed inside the electronic device is exposed to the outside through at least one opening formed in the display device has been described, but is not limited thereto. For example, the electronic device may be disposed in the internal space and may include various electronic components (e.g., a sensor module, a flash, an indicator, etc.) capable of detecting an external environment through the at least one opening formed in the display device.

Figure 10A:
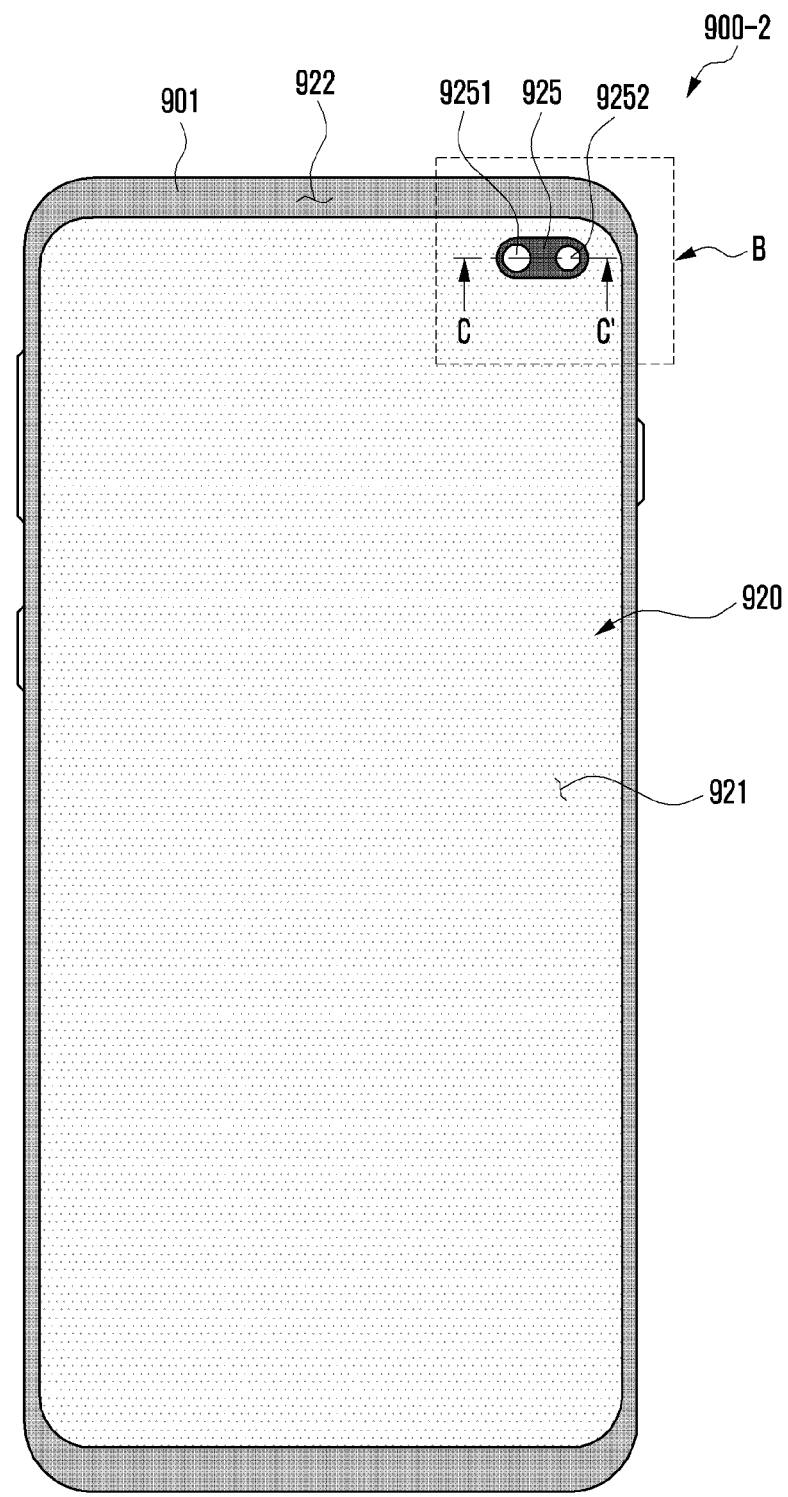
FIG. 10A is a diagram illustrating a state in which a sensor module is disposed around an opening of an example display according to various embodiments of the disclosure.
Figure 10B:
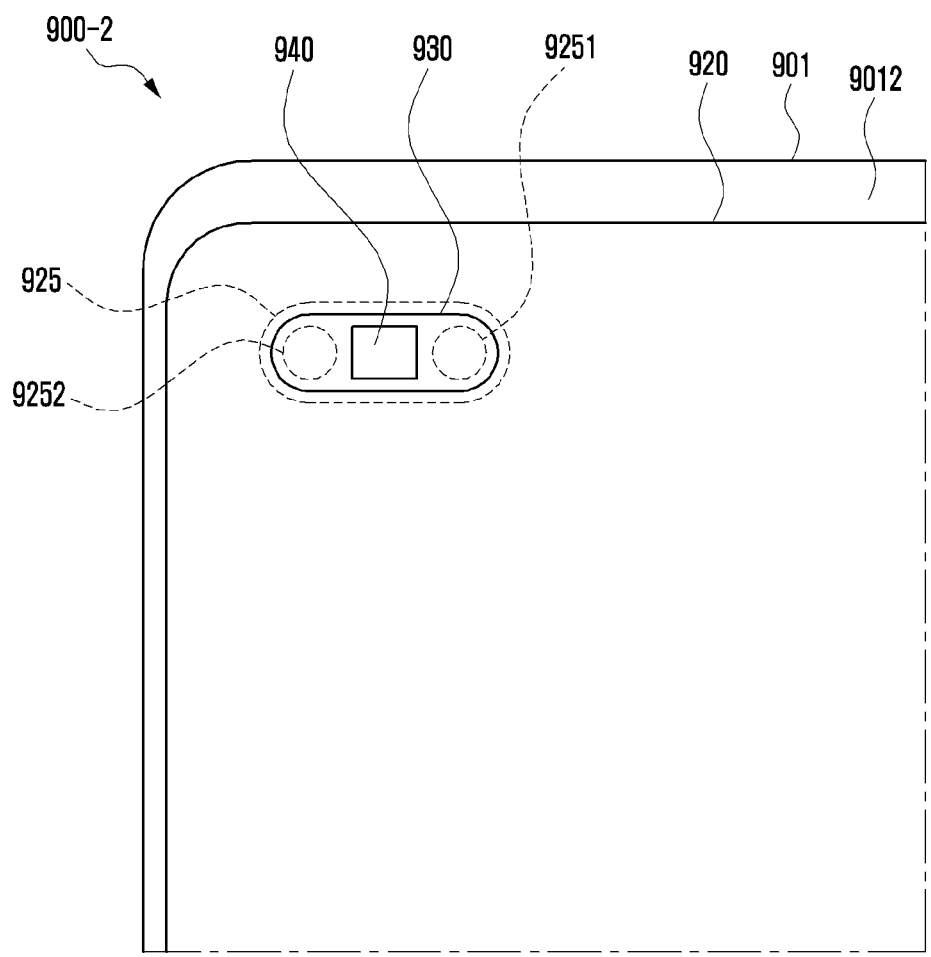
FIG. 10B is a diagram illustrating a state in which a sensor module is disposed around an opening of an example display according to various embodiments of the disclosure.
Figure 10C:
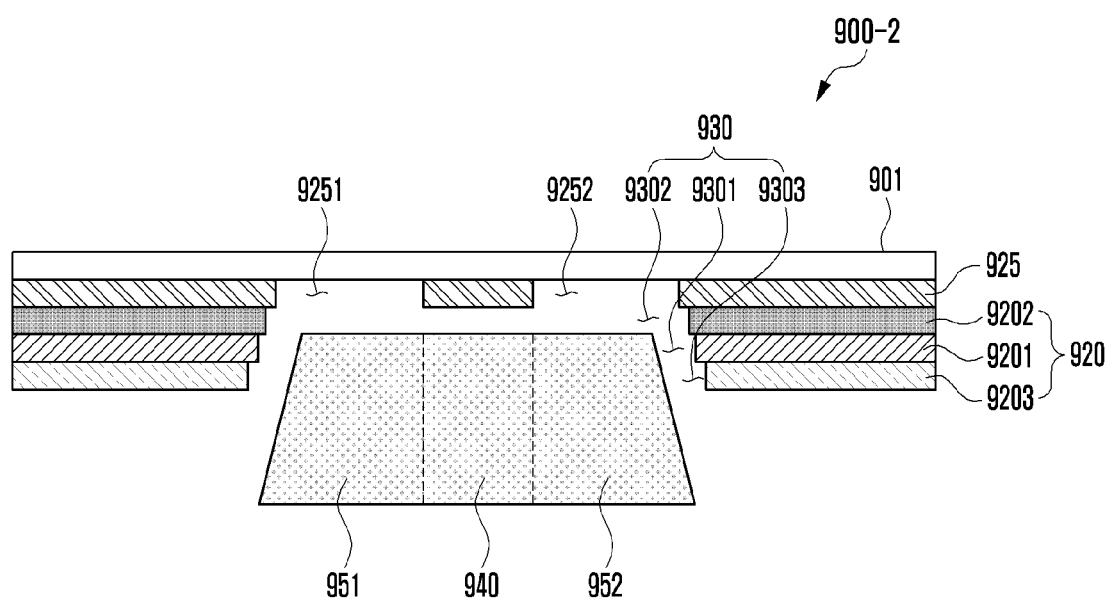
FIG. 10C is a view showing a state in which a sensor module is disposed around an opening of a display according to various embodiments of the disclosure.

FIGS. 10A, 10B and 10C are diagrams illustrating a state in which a sensor module 940 is disposed around an opening 930 of the display 920 according to various embodiments of the disclosure.

FIG. 10B is a configuration view obtained when the area B of FIG. 10A faces in a direction of the rear surface of the front plate 901. FIG. 10C is a partial cross-sectional view showing the electronic device 900-2 viewed from line C-C' of FIG. 10A.

In FIGS. 10A, 10B and 10C, when the electronic device 900-2 is viewed from the outside, the electronic device 900-2 may include a print area 925 having substantially the same shape as the print area 925 of FIG. 9B, but the opening 930 formed in the display 920 has a different shape. Here, the electronic device 900-2 may include a sensor module 940 that is disposed at least partially through the opening 930 and operates.

Referring to FIGS. 10A, 10B and 10C, the display 920 (e.g., the display device 400 of FIG. 4) may be disposed on the rear surface 9012 of the front plate 901. According to an embodiment, the front plate 901 may include the elliptical print area 925. According to an embodiment, the print area 925 may include a pair of camera exposure areas 9251 and 9252 spaced at regular intervals.

According to various embodiments, the display 920 may include an opening 930 of a long hole (e.g., an elliptical shape) that is somewhat smaller in size than the print area 925 and may include the pair of camera exposure areas 9151 and 9252. According to an embodiment, the opening 930 may include a first opening 9301 formed on a display panel 9201 of the display 920, a second opening 9302 formed on an adhesive layer 9202, and a third opening 9303 formed on the support member 9203.

According to various embodiments, when the front plate 901 is viewed from above, the electronic device 900-2 may include a sensor module 940 that is disposed between the two camera exposure areas 9251 and 9252 after the pair of the camera modules 951 and 952 are disposed through the camera exposure areas 9251 and 9252. According to an embodiment, the sensor module 940 may be disposed to be proximate to a rear surface 9012 of the front plate 901 in such a manner that the sensor module 940 at least partially penetrates the opening 930 of the display 920 through the opening 930.

Figure 11A:
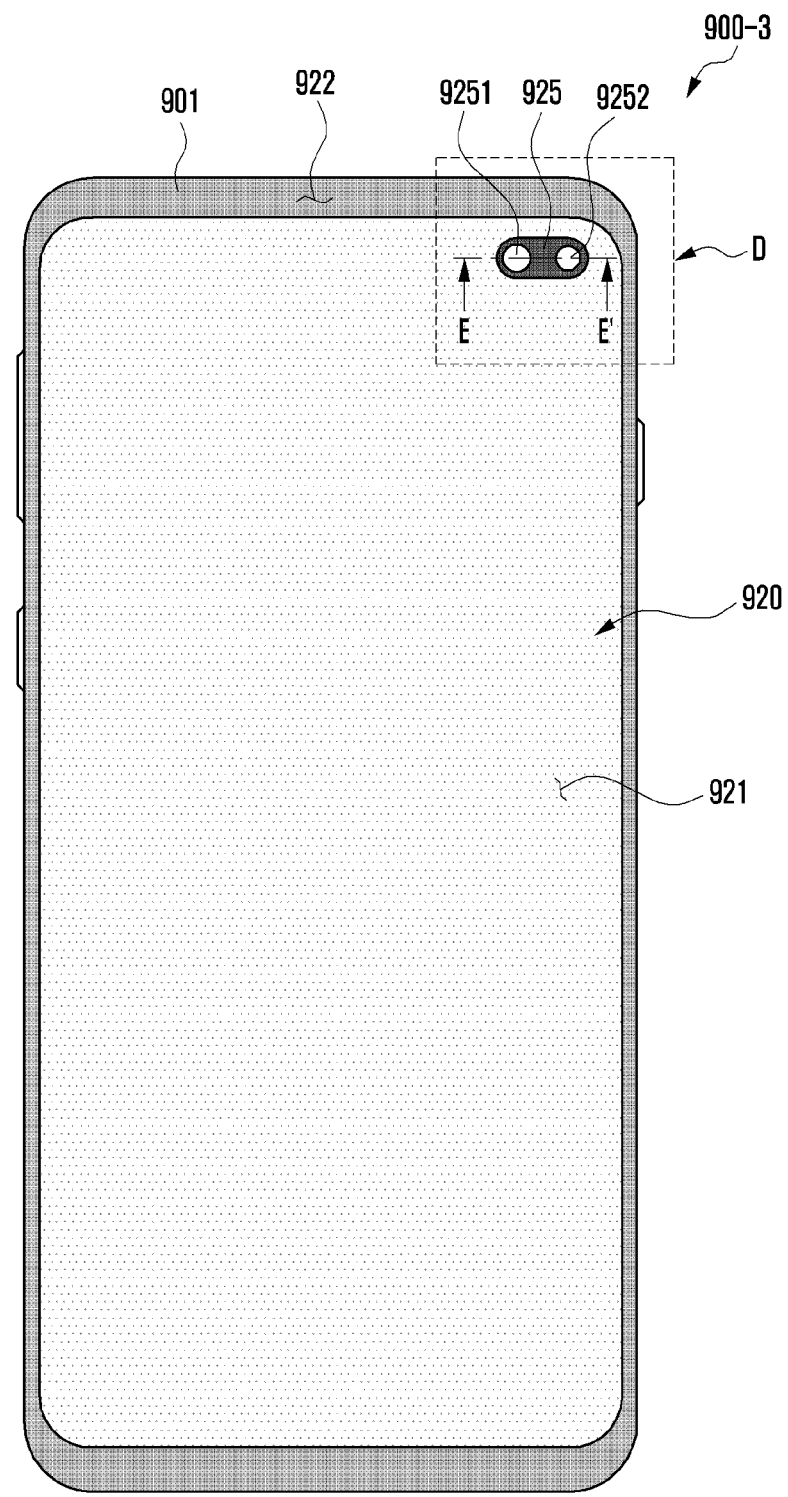
FIG. 11A is a diagram illustrating a state in which a sensor module is disposed around an opening of an example display according to various embodiments of the disclosure.
Figure 11B:
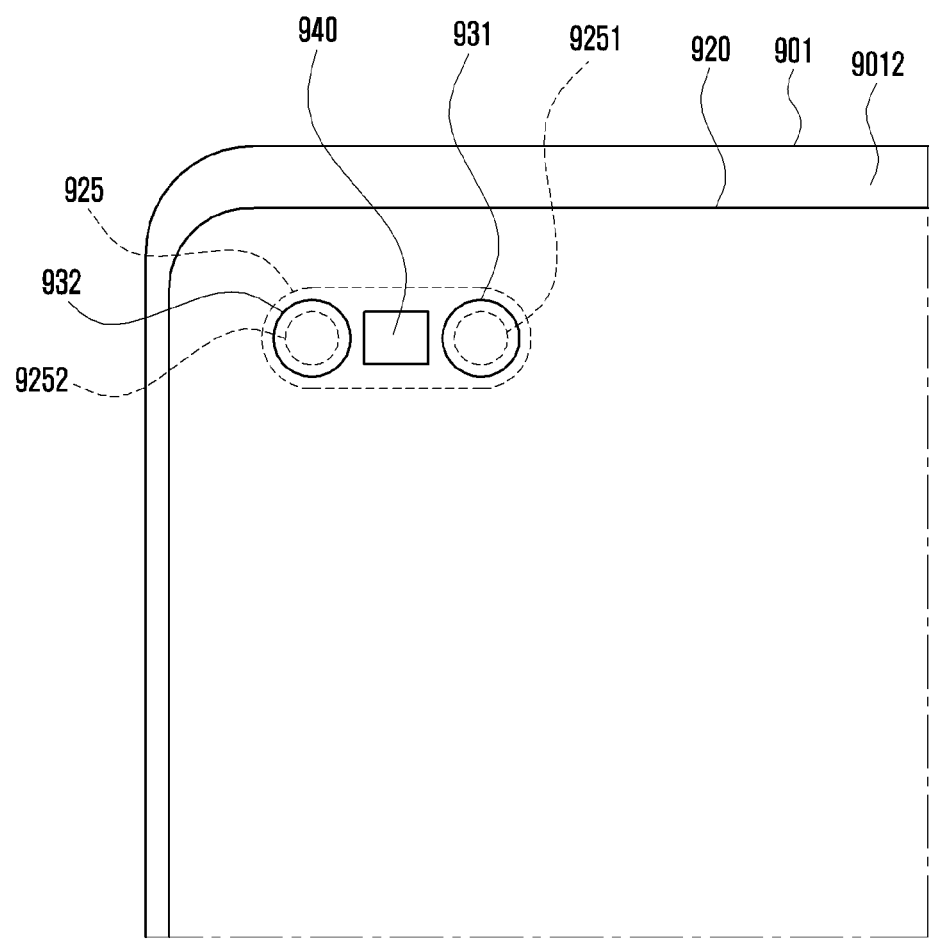
FIG. 11B is a diagram illustrating a state in which a sensor module is disposed around an opening of an example display according to various embodiments of the disclosure.
Figure 11C:
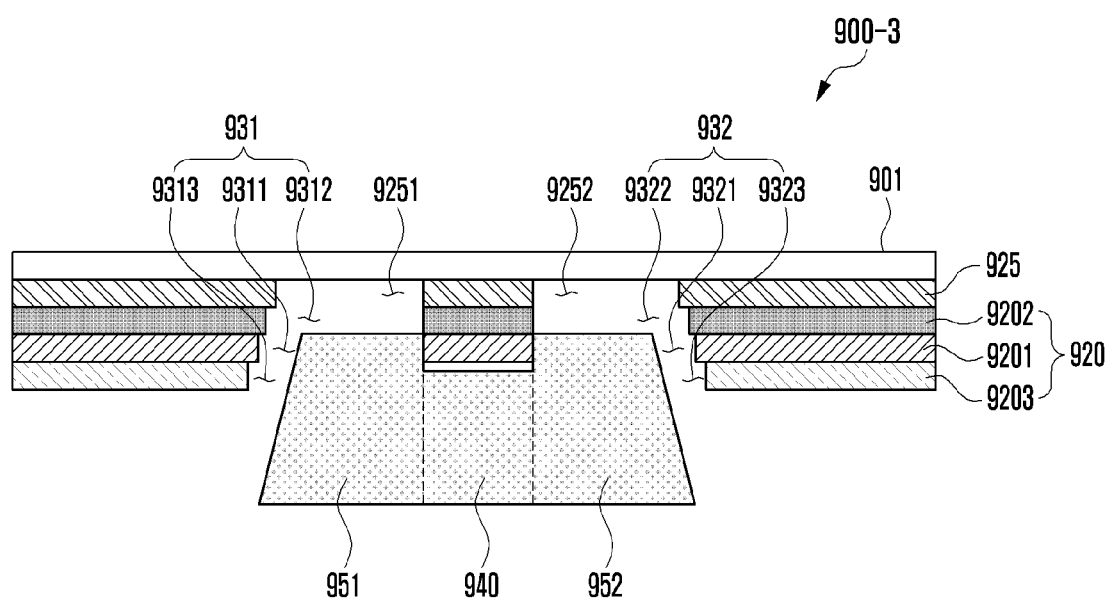
FIG. 11C is a diagram illustrating a state in which a sensor module is disposed around an opening of an example display according to various embodiments of the disclosure.

FIGS. 11A, 11B and 11C are diagrams illustrating a state in which the sensor module 940 is disposed around the openings 931 and 932 of the display 920 according to various embodiments of the disclosure.

FIGS. 11A, 11B and 11C are diagrams illustrating a state in which the sensor module 940 is disposed around the opening 930 of the display 920 according to various embodiments of the disclosure.

FIG. 11B is a configuration view obtained when an area D of FIG. 11A faces in a direction of the rear surface of the front plate 901. FIG. 11C is a partial cross-sectional view showing the electronic device 900-3 viewed from line E-E' of FIG. 11A.

In FIGS. 11A, 11B and 11C, when the electronic device 900-3 is viewed from the outside, the electronic device 900-3 may include a print area 925 having substantially the same shape as the print area 925 of FIG. 9B.

Referring to FIGS. 11A, 11B and 11C, the display 920 (e.g., the display device 400 of FIG. 4) may be disposed on the rear surface 9012 of the front plate 901. According to an embodiment, the front plate 901 may include the print area 925. According to an embodiment, the print area 925 may include a pair of camera exposure areas 9251 and 9252 spaced at regular intervals.

According to various embodiments, the display 920 may include a first opening 931 and a second opening 932 formed to be spaced apart from each other, whereby the display 920 may individually include the respective camera exposure areas 9251 and 9252 within the print area 925. According to an embodiment, the first opening 931 may include a first sub-opening 9311 formed on the display panel 9201 of the display 920, a second sub-opening 9312 formed on the adhesive layer 9202, and a third sub-opening 9313 formed on the support member 9203, as described above. According to an embodiment, the second opening 932 may include a fourth-sub opening 9321 formed on the display panel 9201 of the display 920, a fifth sub-opening 9322 formed on the adhesive layer 9202, and a sixth sub-opening 9323 formed on the support member 9203, as described above. According to an embodiment, third sub-opening 9313 and the sixth sub-opening 9323 may be formed as one connected opening.

According to various embodiments, when the front plate 901 is viewed from above, the electronic device 900-3 may include the sensor module 940 that is disposed between the two camera exposure areas 9251 and 9252 after the pair of the camera modules 951 and 952 are disposed through the pair of camera exposure areas 9251 and 9252. In this case, the sensor module 940 may be disposed between the pair of openings 931 and 932 on the rear surface of the display 920. In another embodiment, the sensor module 940 may be disposed to be seated on a portion (e.g., a recess) formed to be partially omitted from at least one component (e.g., the support member 9203) of the components of the display 920.

According to various embodiments of the disclosure, at the time of an external impact of the electronic device, the adhesive layer in the laminated structure of the display is preferentially brought into contact with an electronic component (e.g., a camera device or an image sensor) to perform a buffering action, and therefore malfunction of the electronic device due to a damage of the display can be prevented and/or reduced.

According to various embodiments, an electronic device (e.g., the electronic device 300 of FIG. 5) may include a front plate (e.g., the front plate 320 of FIG. 5); a display (e.g., the display 430 of FIG. 5) visible from the outside through at least a portion of the front plate and disposed in an internal space of the electronic device, the display including a plurality of layers and a first opening (e.g., the first opening OP1 of FIG. 5); an image sensor (e.g., the camera module 500 of FIG. 5) disposed in the internal space and visible through the first opening; and an adhesive layer including a second opening (e.g., the second opening OP2 of FIG. 5) overlapping the first opening between the front plate and the display, the second opening being smaller than the first opening, wherein an edge of the first opening is not visible when the display is viewed from above.

According to various example embodiments, the electronic device may further include a support (e.g., the support member 440 of FIG. 5) disposed on a rear surface of the display in the internal space, wherein the support may include a third opening (e.g., the third opening OP3 of FIG. 5) overlapping the first opening when the display is viewed from above, and the first opening may be smaller than the third opening, wherein an edge of the third opening is not visible from outside.

According to various example embodiments, a distance (e.g., the distance d2 of FIG. 5) between an edge of the image sensor and the edge of the first opening may be less than a distance (e.g., the distance d3 of FIG. 5) between the edge of the image sensor and the third opening when the display is viewed from above.

According to various example embodiments, a distance (e.g., the distance d1 of FIG. 5) between an edge of the image sensor and an edge of the second opening may be less than a distance (e.g., the distance d2 of FIG. 5) between the edge of the image sensor and the first opening when the display is viewed from above.

According to various example embodiments, the second opening may overlap the first opening and have a same center as the first opening when the display is viewed from above.

According to various example embodiments, the adhesive layer may include at least one of an optical clear adhesive (OCA), a pressure sensitive adhesive (PSA), a thermally reactive adhesive, a general adhesive, or a double-sided tape.

According to various example embodiments, the image sensor may include a camera housing (e.g., the camera housing 510 of FIG. 5) disposed in the space, a barrel (e.g., the barrel 520 of FIG. 5) disposed to at least partially protrude in a direction (e.g., ① direction of FIG. 5) of the front plate from the camera housing, a plurality of lens groups (e.g., the lens group 530 of FIG. 5) disposed in the barrel, and an image sensor disposed to be aligned with the plurality of lens groups in an internal space of the camera housing, and wherein the barrel is disposed such that at least a portion of the is configured to be brought into contact with or approach a rear surface of the front plate in response to an external impact.

According to various example embodiments, the electronic device may further include an exposure area (e.g., the exposure area 4003 of FIG. 7) provided through a print area (e.g., the print area 322 of FIG. 7) disposed on a rear surface of the front plate between the front plate and the adhesive layer, wherein the exposure area overlaps the second opening and is smaller than the second opening, wherein an edge of the second opening is not visible by the print area when the front plate is viewed from above.

According to various example embodiments, the exposure area may be disposed to overlap the first opening and to have the same center as the first opening when the front plate is viewed from above.

According to various example embodiments, the front plate may include a planar portion (e.g., the planar portion 3202 of FIG. 8), and at least one curved portion (e.g., the curved portion 3203 of FIG. 8) extending in an edge direction from the planar portion, and wherein the first opening and the second opening are disposed at a position overlapping at least a portion of the planar portion when the front plate is viewed from above.

According to various example embodiments, the support (e.g., the support member 440 of FIG. 4) may include at least one polymer layer (e.g., the polymer members 441 and 442 of FIG. 4) disposed on a rear surface of the display, a functional member comprising a heat dissipating material (e.g., the functional member 444 of FIG. 4) disposed on a rear side of the polymer layer, and a conductive member comprising a conductive material (e.g., the conductive member 445 of FIG. 4) disposed on a rear surface of the functional member.

According to various example embodiments, the at least one polymer layer may include an emboss layer (e.g., the emboss layer 441 of FIG. 4) and/or a cushion layer (e.g., the cushion layer 442 of FIG. 4).

According to various example embodiments, the functional member may include at least one of a graphite sheet, an added display, a force touch FPCB, a fingerprint sensor FPCB, a communication antenna radiator, a heat dissipation sheet, a conductive/non-conductive tape, or an open cell sponge.

According to various example embodiments, the conductive member may include at least one of Cu, Al, SUS, or CLAD (e.g., a laminated member in which SUS and Al are alternately disposed).

According to various example embodiments, an electronic device (e.g., the electronic device 300 of FIG. 5) may include: a front plate (e.g., the front plate 320 of FIG. 5); a display (e.g., the display 430 of FIG. 5) visible from outside the electronic device through at least a portion of the front plate and disposed in an internal space of the electronic device, the display including a plurality of layers and at least one first opening (e.g., the first opening OP1 of FIG. 5); at least one electronic component comprising electronic circuitry (e.g., the camera module 500 of FIG. 5 or the sensor module 104 of FIG. 1) configured to detect an external environment through the at least one first opening from the internal space; and an adhesive layer including at least one second opening (e.g., the second opening OP2 of FIG. 5) overlapping the first opening between the front plate and the display, the second opening being smaller than the first opening, wherein an edge of the first opening is not visible when the display is viewed from above.

According to various example embodiments, the at least one second opening may overlap the at least one first opening to have a same center as the at least one first opening when the display is viewed from above.

According to various example embodiments, the electronic device may further include: an exposure area provided through a print area disposed on a rear surface of the front plate between the front plate and the adhesive layer, wherein the exposure area overlaps the second opening and is smaller than the second opening, wherein an edge of the second opening is not visible by the print area when the front plate is viewed from above.

According to various example embodiments, the exposure area may overlap the first opening to have the same center as the first opening when the front plate is viewed from above.

According to various example embodiments, two or more of the first openings and the second openings may overlap each other through the exposure area when the front plate is viewed from above.

According to various example embodiments, the front plate may include a planar portion, and at least one curved portion extending in an edge direction from the planar portion, and wherein the at least one first opening and the at least one second opening are disposed at a position overlapping at least a portion of the planar portion when the front plate is viewed from above.

According to various example embodiments, the at least one electronic component may include a sensor module, a flash, an indicator, or a camera module.

The various example embodiments of the disclosure and the drawings are merely examples provided to easily describe the technical features of the disclosure and aid in understanding of the disclosure, and do not limit the scope of the disclosure. Therefore, in addition to the example embodiments disclosed herein, the scope of the various example embodiments of the disclosure should be understood to include all modifications or modified forms drawn based on the technical idea of the various embodiments of the disclosure.

What is claimed is:

1. An electronic device comprising:
   a front plate;
   a display visible from outside the electronic device through at least a portion of the front plate and disposed in an internal space of the electronic device, the display including a plurality of layers and a first opening;
   a camera module, comprising a sensor, disposed in the internal space and visible through the first opening;
   an adhesive layer including a second opening overlapping the first opening and disposed between the front plate and the display, the second opening being smaller than the first opening, wherein an edge of the first opening is not visible when the display is viewed from above; and
   a print area disposed on a rear surface of the front plate between the front plate and the adhesive layer, wherein the print area includes an exposure area, and
   wherein the exposure area overlaps the second opening and is smaller than the second opening wherein an edge of the second opening is not visible by the print area when the front plate is viewed from above.

2. The electronic device of claim 1, further comprising:
   a support disposed on a rear surface of the display in the internal space, wherein
   the support includes a third opening overlapping the first opening when the display is viewed from above,
   the first opening being smaller than the third opening wherein an edge of the third opening is not visible from outside the electronic device.

3. The electronic device of claim 2, wherein a distance between an edge of the camera module and the edge of the first opening is less than a distance between the edge of the camera module and the third opening when the display is viewed from above.

4. The electronic device of claim 2, wherein the support comprises:
- at least one polymer layer disposed on a rear surface of the display;
- a functional member comprising a heat dissipating material disposed on a rear side of the polymer layer; and
- a conductive member comprising a conductive materials disposed on a rear surface of the functional member.

5. The electronic device of claim 4, wherein the functional member includes at least one of a graphite sheet, an added display, a force touch FPCB, a fingerprint sensor FPCB, a communication antenna radiator, a heat dissipation sheet, a conductive/non-conductive tape, or an open cell sponge.

6. The electronic device of claim 4, wherein the conductive member includes at least one of Cu, Al, SUS, or CLAD.

7. The electronic device of claim 1, wherein a distance between an edge of the camera module and an edge of the second opening is less than a distance between the edge of the camera module and the first opening when the display is viewed from above.

8. The electronic device of claim 1, wherein the second opening overlaps the first opening and has a same center as the first opening when the display is viewed from above.

9. The electronic device of claim 1, wherein the adhesive layer includes at least one of an optical clear adhesive (OCA), a pressure sensitive adhesive (PSA), a thermally reactive adhesive, a general adhesive, or a double-sided tape.

10. The electronic device of claim 1, wherein the camera module comprises:
- a camera housing disposed in the internal space;
- a barrel disposed to at least partially protrude in a direction of the front plate from the camera housing;
- a plurality of lens groups disposed in the barrel; and
- an image sensor disposed to be aligned with the plurality of lens groups in an internal space of the camera housing, and wherein the barrel is disposed such that at least a portion of the barrel is configured to be brought into contact with or to approach a rear surface of the front plate through the first opening and the second opening.

11. The electronic device of claim 1, wherein the exposure area is disposed to overlap the first opening and to have a same center as the first opening when the front plate is viewed from above.

12. The electronic device of claim 1, wherein the front plate comprises:
- a planar portion; and
- at least one curved portion extending in an edge direction from the planar portion, and wherein
the first opening and the second opening are disposed at a position overlapping at least a portion of the planar portion when the front plate is viewed from above.

13. An electronic device comprising:
- a front plate;
- a display visible from outside the electronic device through at least a portion of the front plate and disposed in an internal space of the electronic device, the display including a plurality of layers and at least one first opening;
- at least one electronic component comprising electronic circuitry configured to detect an external environment through the at least one first opening from the internal space;
- an adhesive layer including at least one second opening overlapping the first opening and disposed between the front plate and the display, the second opening being smaller than the first opening wherein an edge of the first opening is not visible when the display is viewed from above; and
- a print area disposed on a rear surface of the front plate between the front plate and the adhesive layer, wherein the print area including an exposure area, and
wherein the exposure area overlaps the second opening and is smaller than the second opening wherein an edge of the second opening is not visible by the print area when the front plate is viewed from above.

14. The electronic device of claim 13, wherein the at least one second opening is disposed to overlap the at least one first opening and to have a same center as the at least one first opening when the display is viewed from above.

15. The electronic device of claim 13, wherein the exposure area is disposed to overlap the first opening and to have a same center as the first opening when the front plate is viewed from above.

16. The electronic device of claim 13, wherein two or more of the first openings and the second openings overlap each other through the exposure area when the front plate is viewed from above.

17. The electronic device of claim 13, wherein the front plate comprises:
- a planar portion; and
- at least one curved portion extending in an edge direction from the planar portion, and wherein
the at least one first opening and the at least one second opening overlap at least a portion of the planar portion when the front plate is viewed from above.

18. The electronic device of claim 13, wherein the at least one electronic component includes a sensor module, a flash, an indicator, or a camera module.

* * * * *